(12) United States Patent
Wagner

(10) Patent No.: US 8,604,839 B2
(45) Date of Patent: Dec. 10, 2013

(54) FILTER COMPRISING A CURRENT-TO-VOLTAGE CONVERTER

(75) Inventor: Elmar Wagner, Taufkirchen (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/289,448

(22) Filed: Nov. 4, 2011

(65) Prior Publication Data

US 2012/0112798 A1    May 10, 2012

(30) Foreign Application Priority Data

Nov. 10, 2010  (DE) .......................... 10 2010 043 730

(51) Int. Cl.
*H02M 11/00*    (2006.01)
(52) U.S. Cl.
USPC .......................................... 327/103; 327/552
(58) Field of Classification Search
USPC .......................................... 327/103, 551–559
See application file for complete search history.

(56) References Cited

U.S. PATENT DOCUMENTS

| | | | | |
|---|---|---|---|---|
| 3,602,820 A * | 8/1971 | Kaufman | ....................... | 455/218 |
| 3,643,173 A * | 2/1972 | Whitten | ......................... | 330/253 |
| 3,757,240 A * | 9/1973 | Fogg | ............................... | 330/254 |
| 3,783,412 A * | 1/1974 | Libby | ............................ | 333/174 |
| 3,831,103 A * | 8/1974 | Ruegg et al. | ................... | 330/109 |
| 3,835,399 A * | 9/1974 | Holmes | .......................... | 327/555 |
| 3,946,328 A * | 3/1976 | Boctor | ........................... | 330/107 |
| 4,158,818 A * | 6/1979 | Lerner | ............................ | 327/557 |
| 4,292,468 A * | 9/1981 | Yokoyama | ....................... | 330/85 |
| 4,382,233 A * | 5/1983 | Hofer | ............................. | 330/107 |
| 4,453,132 A * | 6/1984 | Stamler | ......................... | 330/107 |
| 4,563,652 A * | 1/1986 | Hofer | ............................. | 330/107 |
| 7,376,409 B2 * | 5/2008 | Pan | ................................ | 455/307 |
| 7,536,107 B2 * | 5/2009 | Paillet et al. | ................... | 398/140 |
| 7,592,864 B2 * | 9/2009 | Kang et al. | ...................... | 327/558 |
| 7,652,531 B2 * | 1/2010 | Wang et al. | ...................... | 330/99 |
| 7,852,152 B2 * | 12/2010 | Baranauskas et al. | ......... | 330/109 |
| 8,143,946 B2 * | 3/2012 | Aram | ............................. | 330/253 |

\* cited by examiner

*Primary Examiner* — William Hernandez
(74) *Attorney, Agent, or Firm* — Eschweiler & Associates, LLC

(57) ABSTRACT

A current-to-voltage converter for providing a voltage signal based on a current signal has a first active stage having an input and an output. The first active stage is configured to receive the current signal at its input and provide the voltage signal at its output. In addition, the current-to-voltage converter has a second active stage that is coupled between the output of the first active stage and the input of the first active stage. The second active stage is configured to provide the input of the first active stage with a feedback signal that frequency-selectively counteracts amplification, by the first active stage, of signal components of a current signal applied to the input of the first active stage that have a frequency outside of a prescribed useful frequency band.

16 Claims, 9 Drawing Sheets

FILTER COMPRISING A CURRENT-TO-VOLTAGE CONVERTER

RELATED APPLICATION

This application claim priority to German Application Number DE 102010043730.1 filed on Nov. 10, 2010.

FIELD

Exemplary embodiments of the present invention comprise a current-to-voltage converter, as may be used in a receiver for a mobile telephone, for example. Further exemplary embodiments comprise a receiver, as may be used in a mobile radio telephone, for example. Further exemplary embodiments comprise a method for providing a voltage signal based on a current signal. Further exemplary embodiments comprise a method for receiving a received signal, for example a mobile radio signal.

BACKGROUND

Some mobile telephone standards require simultaneous transmission and reception (what is known as full duplex). In this case, a duplexer typically reduces the transmission signal (TX signal) at the receiver input to a substantial degree. Nevertheless, there is a strong signal at the receiver input (RX input), and this signal is down converted to baseband in the reception mixer (RX mixer) and, upstream of the analog-to-digital converter (ADC), is attenuated, or in some cases even needs to be attenuated, by filtering. In other words, in some cases it is difficult to process a signal that has a comparatively weak level at a useful frequency and has a comparatively strong level at an undesirable interference frequency which is none too far from the useful frequency. A first pole (for example a first low-pass filter) downstream of the mixer performs current-to-voltage conversion using a first-order filter, that results in a large voltage swing at the output of the filter, since at the transmission offset frequency (Tx offset frequency) the first-order filter is able to achieve only a small amount of rejection.

The signal level of the transmission signal in the reception chain can be reduced by using intermediate stage filters in the RF chain, for example. Alternatively, it is possible to use a first pole having an operational amplifier, that can handle a large signal swing by using a large supply voltage. This can result in some systems not being able to be designed without an intermediate stage filter if the supply voltage would otherwise become too large.

SUMMARY

Exemplary embodiments of the present invention provide a current-to-voltage converter for providing a voltage signal based on a current signal. The current-to-voltage converter comprises a first active stage having an input and an output. The first active stage is configured to receive the current signal at its input and provide the voltage signal at its output. In addition, the current-to-voltage converter comprises a second active stage that is coupled between the output of the first active stage and the input of the first active stage. The second active stage is designed to provide a feedback signal to the input of the first active stage. The feedback signal frequency-selectively counteracts amplification, by the first active stage, of signal components of the current signal received at the input of the first active stage which have a frequency outside of a prescribed useful frequency band.

Further exemplary embodiments of the present invention provide a receiver having a mixer and a current-to-voltage converter as cited above. In this case, the mixer is designed to down convert a received signal to a baseband in order to obtain a baseband signal, and in order to provide the baseband signal for the current-to-voltage converter at the input of the first active stage of the current-to-voltage converter as the current signal.

BRIEF DESCRIPTION OF THE FIGURES

Exemplary embodiments of the present invention are described in detail below with reference to the appended figures, in which.

DETAILED DESCRIPTION

Before exemplary embodiments are explained in more detail below with reference to the appended figures, it is pointed out that elements which are the same or elements which have the same function have been provided with the same reference symbols and that these elements have not been described repeatedly. Descriptions of elements having the same reference symbols are therefore interchangeable with one another.

Figure 1:
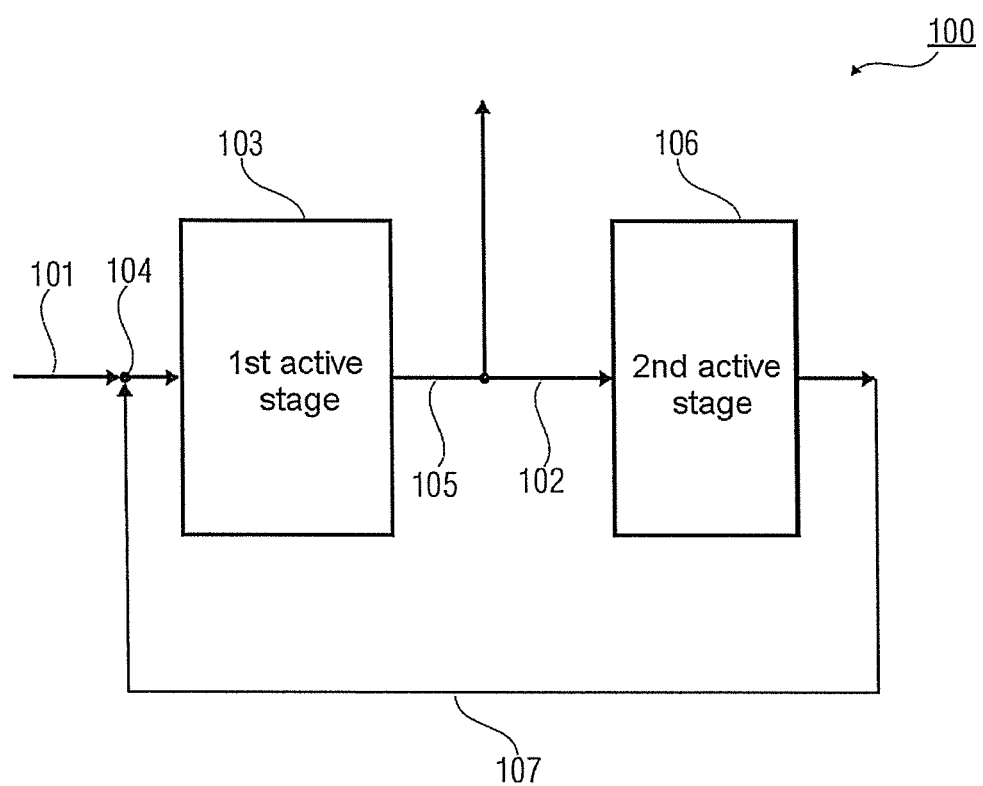
FIG. 1 shows a block diagram of a current-to-voltage converter according to one exemplary embodiment.

FIG. 1 shows a block diagram of a current-to-voltage converter 100 according to one exemplary embodiment. The current-to-voltage converter 100 is configured to provide a voltage signal 102 based on a current signal 101, and has a first active stage 103 having an input 104 and an output 105. The input 104 of the first active stage 103 can also be referred to as an input node 104. In addition, the current-to-voltage converter 100 has a second active stage 106 that is coupled between the output 105 of the first active stage 103 and the input 104 of the first active stage 103.

The first active stage 103 is configured to receive the current signal 101 at its input 104 and provide the voltage signal 102 at its output 105.

The input 104 of the first active stage 103 may therefore be connected directly to an input of the current-to-voltage converter 100, and the output 105 of the first active stage 103 may therefore be connected directly to an output of the current-to-voltage converter 100.

The second active stage 106 is configured to provide a feedback signal 107 at the input 104 of the first active stage 103. The feedback signal 107 counteracts amplification, by the first active stage 103, of signal components of the current signal 101 received at the input 104 of the first active stage 103 that have a frequency outside of a prescribed useful frequency band.

It is a notion of exemplary embodiments that improved current-to-voltage conversion can be performed when signal components of a current signal to be converted that are outside of a prescribed useful frequency band are attenuated by a feedback signal that is injected as early as upstream of the current-to-voltage conversion. In exemplary embodiments, this attenuation is achieved by applying the feedback signal 107 to the input 104 of the first active stage 103 in order to counteract the signal components of the current signal 101 that have a frequency outside of the prescribed useful frequency band at that location.

The counteraction of the feedback signal 107 allows the attenuation of effective amplitudes of the signal components of the current signal 101 that are outside of the prescribed useful frequency band, as a result of which these signal components are amplified by the first active stage 103 to a lesser degree than signal components that are inside of the prescribed useful frequency band. This allows a maximum voltage for the voltage signal 102 at the output 105 of the first active stage 103 to be kept at a low level.

As already described in the introductory part of this application, there is the problem, for example in the case of filtering downstream of an RX mixer, that only a small amount of rejection can be achieved for the TX offset frequency in the case of a first-order filter. This often results in a large signal swing at the output of such a filter (for example a simple first-order filter) and hence in a large required supply voltage for an associated operational amplifier. It has been found that a second-order filter upstream of conversion of the input signal to form a voltage signal would allow this restriction to be overcome. It has likewise been found that standard designs for higher-order filters cannot be used for this filtering task, since the source of the signal is a current source, that requires a low-impedance termination. Customary higher-order filters frequently use voltage input signals in conjunction with resistors at the input that do not have low input impedances and therefore cannot be used for the current-to-voltage conversion.

When the current-to-voltage converter 100 shown in FIG. 1 is used in a receiver in a mobile telephone, for example downstream of an RX mixer, in order to convert a current signal that output by the RX mixer into a voltage signal, the aforementioned remaining TX signal may be present in the form of a signal component of the current signal 101 that is outside of the prescribed useful frequency band, for example. As a result of the counteraction of the feedback signal 107, these signal components can be attenuated or compensated for as early as at the input 104 of the first active stage 103, as a result of which a gain in these signal components is reduced in the first active stage 103 and hence also a maximum signal swing in the voltage signal 102 is reduced (for example in comparison with systems that merely perform first-order filtering). The first active stage 103 can therefore operate at lower supply voltages than an operational amplifier, that is used downstream of an RX mixer in the simple first-order low-pass filters cited above.

Exemplary embodiments of the present invention therefore allow filtering without an intermediate stage filter and with a fairly low supply voltage. The attenuation or compensation for the signal components that have a frequency outside of the prescribed useful frequency band before the voltage range is entered allows a much greater signal handling capability for the remaining TX signal.

Exemplary embodiments therefore allow a current-to-voltage converter without an intermediate stage filter with a fairly low supply voltage that a great signal handling capability for an incoming current signal.

According to some exemplary embodiments, the first active stage 103 may be a first-order low-pass filter, for example. This first-order low-pass filter may be in the form of an active low-pass filter, for example, by virtue of a suitable operational amplifier circuit. In other words, the first active stage 103 may have a first-order low-pass filter characteristic. By way of example, the second active stage 106 may be in the form of an amplifier element acting as a voltage-controlled current source, in the form of a voltage-controlled current source or in the form of a current amplifier stage and may have a high-pass filter characteristic. The effect that can be achieved by the feedback signal 107 provided by the second active stage 106 at the input 104 of the first active stage 103 is that an overall transfer function for the current-to-voltage converter 100 shown in FIG. 1 corresponds to a low-pass transfer function of an order greater than 1, for example a second-order low-pass transfer function. This allows better attenuation of the signal components that have a frequency outside of the prescribed useful frequency band, as a result of which they have less influence on the voltage signal 102. In relation to the example of the use of the current-to-voltage converter 100 in a receiver, in which a remaining TX signal would result in a large signal swing if using only a first-order filter, exemplary embodiments therefore allow greater attenuation to be achieved by virtue of the second-order filtering of these signal components.

In other words, exemplary embodiments implement a current-to-voltage converter that effectively has second-order filtering before the voltage range is entered, which results in a much greater (in comparison with some conventional amplifiers) signal handling capability for the remaining TX signal (which is situated in the signal components outside of the prescribed frequency band). Some exemplary embodiments therefore use a first pole (or a circuit arrangement for implementing a first pole) having an operational amplifier (as part of the first active stage 103) and add a further current amplifier (as part of the second active stage 106) in order to improve the filtering from a first-order design to a second-order design.

In other words, in one embodiment the first active stage 103 and the second active stage 106 are configured such that an overall transfer function for the current-to-voltage converter 100 from the input 104 of the first active stage 103 to the output 105 of the first active stage 103 corresponds to a low-pass filter transfer function having an order greater than 1.

According to some exemplary embodiments, the second active stage 106 is configured to provide the feedback signal 107 as a feedback current signal which is directed against the received current signal 101. This feedback current signal may also be based on the voltage signal 102 at the output 105 of the first active stage 103. In other words, the first active stage 103 can perform current-to-voltage conversion of the current signal 101 into the voltage signal 102, and the second active stage 106 can perform voltage-to-current conversion of the voltage signal 102 into the feedback current signal. As already mentioned, the first active stage 103 may in this case have a low-pass filter characteristic and the second active stage 106 may have a high-pass filter characteristic. Since the first active stage 103 is designed to receive the current signal 101, an input impedance at the input 104 of the first active stage 103 may be low (for example less than 100 ohms, less than 50 ohms, less than 20 ohms or even less than 10 ohms)

for the prescribed useful frequency band. An output impedance of the second active stage 106 may be higher (for example by a factor of greater than 50, greater than 100, greater than 500 or even greater than or equal to 1000) than the input impedance of the first active stage 103.

As already mentioned, the second active stage 106 may have a high-pass filter characteristic. In addition, the second active stage 106 according to some exemplary embodiments is configured such that a gain in the voltage signal 102 applied to the output 105 of the first active stage 103 increases as the frequency of the voltage signal 102 applied to the output 105 of the first active stage 103 rises. The effect that can be achieved by the fact that the amplification by the second active stage 106 increases as the frequency of the voltage signal 102 rises is that the feedback current signal is provided with a higher amplitude for frequencies outside of the prescribed useful frequency band or for frequencies above the prescribed useful frequency band than for frequencies inside of the prescribed useful frequency band. The effect that can be achieved by this is that the feedback loop from the second active stage 106 to the input 104 of the first active stage 103 means that the signal components of the current signal 101 outside of the useful frequency band are attenuated to a greater degree than the signal components inside of the useful frequency band.

As already mentioned, the first active stage 103 may have a first-order low-pass filter characteristic. By way of example, the first active stage 103 according to some exemplary embodiments is configured to impress a compensating current that rises as the frequency of the received current signal 101 rises into its input 104 in order to form the aforementioned first-order low-pass filter. In this case, the second active stage 106 is configured to provide the feedback current signal at the input 104 of the first active stage 103 such that the feedback current signal 107 is superimposed on the compensating current impressed by the first active stage 103 at least outside of the useful frequency band at the input 104 of the first active stage 103, as a result of which an overall transfer function from the input 104 of the first active stage 103 to the output 105 of the first active stage 103 has a characteristic of a low-pass filter of an order greater than 1.

Figure 2:
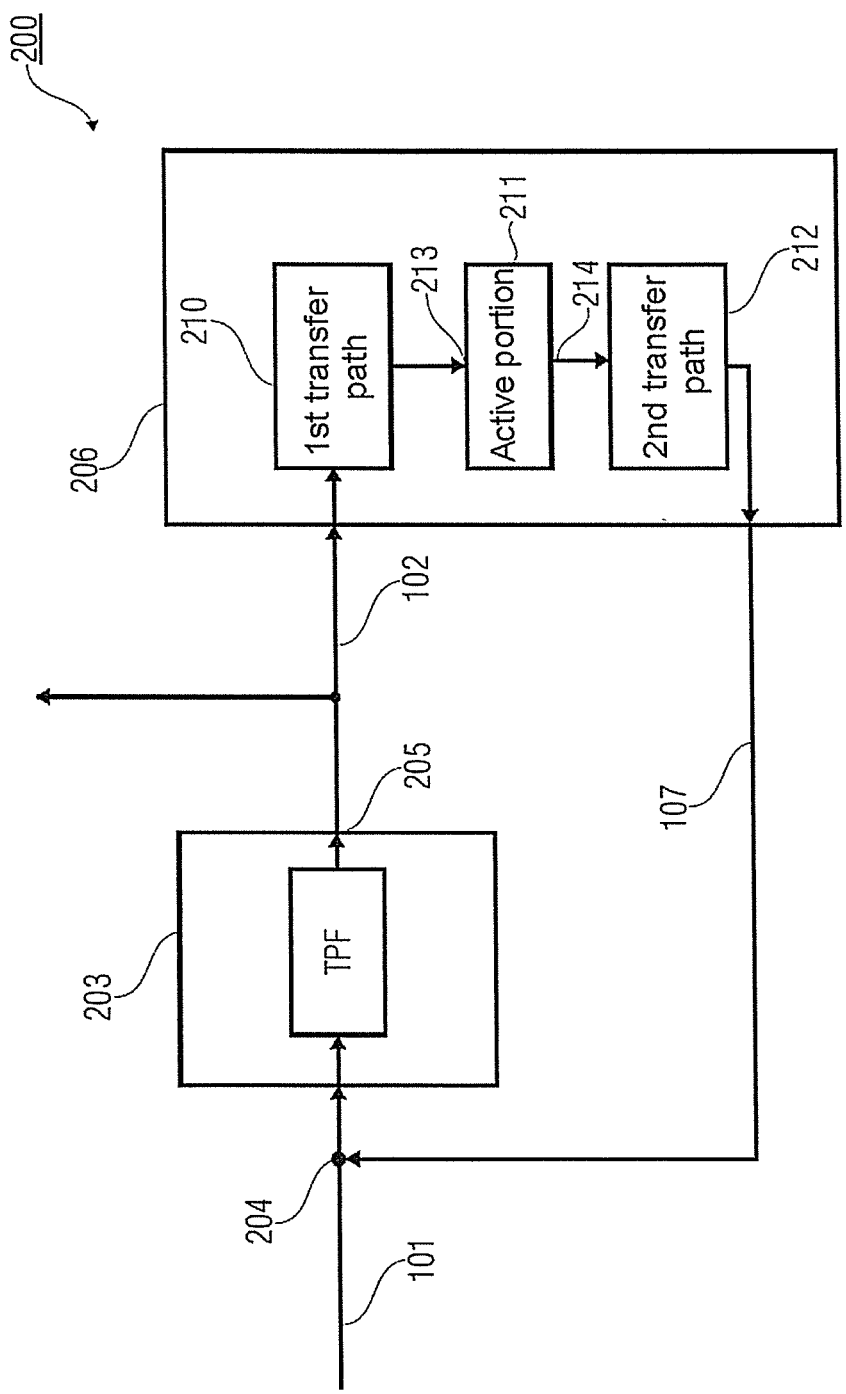
FIG. 2 shows a block diagram of a current-to-voltage converter according to a further exemplary embodiment.

FIG. 2 shows a block diagram of a current-to-voltage converter 200 according to a further exemplary embodiment. The current-to-voltage converter 200 has a first active stage 203 having an input 204 and an output 205, and a second active stage 206. The first active stage 203 may correspond, in terms of its basic function, to the first active stage 103 shown in FIG. 1, for example, with further optional details being shown in FIG. 2. Similarly, the second active stage 206 may correspond, in terms of its basic function, to the second active stage 106 shown in FIG. 1, for example, with further optional details being shown in FIG. 2. In the case of the current-to-voltage converter 200 shown in FIG. 2, the first active stage 203 acts as a low-pass filter. In addition, a first transfer path 210 from the output 205 of the first active stage 203 to an input 213 of an active portion 211 of the second active stage 206 has a first high-pass filter characteristic. In this case, a transfer path is also sometimes referred to as a signal path.

The first transfer path 210 or elements of the first transfer path 210 that produce the high-pass filter characteristic may be part of the second active stage 206.

In addition, a second transfer path 212 from an output 214 of the active portion 211 of the second active stage 206 to the input 204 of the first active stage 203 has a second high-pass filter characteristic. The second transfer path 212 or elements of the second transfer path 212 which produce the high-pass filter characteristic may also be part of the second active stage 206.

By way of example, the active portion 211 may be an element acting as a voltage-controlled current source or another amplifier circuit.

By way of example, the first high-pass filter characteristic of the first transfer path 210 can be produced by a passive high-pass filter element in conjunction with an input impedance of the active portion 211, for example by connecting a capacitor upstream between the output 205 of the first active stage 203 and the input 213 of the active portion 211 of the second active stage 206. Similarly, the second high-pass filter characteristic of the second transfer path 212 can be produced by using a further passive high-pass filter component in conjunction with an input impedance at the input 204 of the first active stage 203 and in conjunction with an output impedance of the active portion 211 of the second active stage, for example by connecting a capacitor between the output 214 of the active portion 211 of the second active stage 206 and the input 204 of the first active stage 203.

The effect that can be achieved by the first high-pass filter characteristic upstream of the active portion 211 (or between the output 205 of the first active stage 203 and the input 213 of the active portion 211 of the second active stage 206) is that only or primarily the signal components of the voltage signal 102 that are outside of the prescribed useful frequency band are amplified by the active portion 211. This frequency selectivity of the feedback of the signal components outside of the prescribed useful frequency band can be amplified further by the second high-pass filter characteristic. The feedback signal 107 therefore contains primarily amplified signal components outside of the prescribed useful frequency band, whereas signal components inside of the prescribed useful frequency band in the feedback signal 107 are amplified to a lesser extent or even attenuated. The amplified signal components outside of the prescribed useful frequency band can be superimposed on the current signal 101 at the input 204 of the first active stage 203 and counteract the signal components of the current signal 101 outside of the prescribed useful frequency band at that location, as a result of which these signal components are attenuated in an effective (summed) input signal for the first active stage 203 and signal components in the prescribed useful frequency band are not (or only very slightly) attenuated in the effective (summed) input signal.

When the current-to-voltage converter 200 is used in a mobile radio receiver, for example, the remaining (undesirable) TX signal components (signal components outside of the prescribed useful frequency band) in the current signal 101 may have a higher amplitude than the desired RX signal components (signal components inside of the prescribed useful frequency band). The feedback with the feedback signal 107 allows precisely these undesirable TX signal components to be attenuated or partially compensated for as early as upstream of the low-pass filtering by the first active stage 203, as a result of which an undesirably large signal swing in the voltage signal 102 at the output 205 of the first active stage 203 can be avoided. An active element implementing the low-pass filter characteristic of the first active stage 203 may therefore have a lower supply voltage than in alternative systems in which only first-order filtering is effected and no feedback takes place upstream of the first-order filtering. In the case of the current-to-voltage converter 200 shown in FIG. 2, on the other hand, filtering of a higher order than 1 (in the specific example the order is 2) is achieved, as a result of which the signal components of the current signal 101 outside of the prescribed useful frequency band are attenuated, to a significantly greater degree than in the case of first-order filtering.

Figure 3:
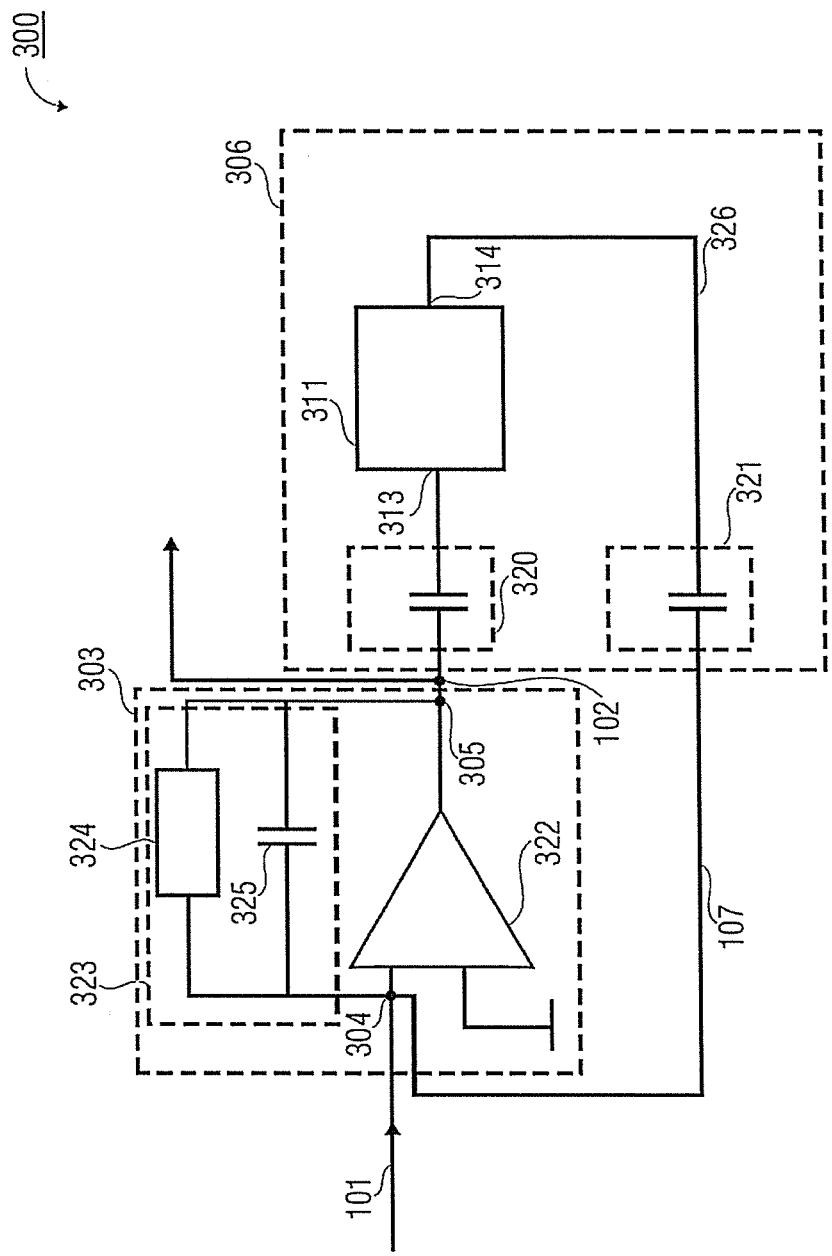
FIG. 3 shows a block diagram of a current-to-voltage converter according to a further exemplary embodiment.

FIG. 3 shows a block diagram of a current-to-voltage converter 300 according to a further exemplary embodiment. The current-to-voltage converter 300 shown in FIG. 3 may be a specific implementation of the current-to-voltage converter 200 shown schematically in FIG. 2, for example. The current-to-voltage converter 300 therefore has a first active stage 303 having an input 304 and an output 305. In addition, the current-to-voltage converter 300 has a second active stage 306. The second active stage 306 has an active portion that is implemented in the current-to-voltage converter 300 shown in FIG. 3 using an element 311 acting as a voltage-controlled current source.

The element 311 acting as a voltage-controlled current source can subsequently also be referred to as a voltage-controlled current source 311.

As in the case of the current-to-voltage converter 200 already, a first transfer path from the output 305 of the first active stage 303 to an input 313 of the voltage-controlled current source 311 has a first high-pass filter characteristic. This first high-pass filter characteristic is achieved by a coupling capacitor 320 connected between the input 313 of the voltage-controlled current source 311 and the output 305 of the first active stage 303. A second transfer path from an output 314 of the voltage-controlled current source 311 to the input 304 of the first active stage 303 has a second high-pass filter characteristic in this case too. This second high-pass filter characteristic is achieved in one embodiment by connecting a feedback capacitor 321 between the output 314 of the voltage-controlled current source 311 and the input 304 of the first active stage 303. The coupling capacitor 320 forms a first high-pass filter with an input impedance of the voltage-controlled current source 311 (and possibly an output impedance of the first active stage 303), and the feedback capacitor 321 forms a second high-pass filter with an input impedance of the first active stage 303 (and possibly an output impedance of the voltage-controlled current source 311).

As already mentioned, an output impedance of the voltage-controlled current source 311 may be higher (for example at least by a factor of greater than 50, greater than 100, greater than 500 or even greater than or equal to 1000) than an input impedance at the input 304 of the first active stage 303.

The voltage-controlled current source 311 can provide the feedback signal 107 as a feedback current signal, based on a high-pass-filtered version (by the coupling capacitor 320) of the voltage signal 102. By way of example, the high-pass-filtered version of the voltage signal 102 may be present between an output of the first transfer path and the input 313 of the voltage-controlled current source 311.

In the specific exemplary embodiment shown in FIG. 3, the first active stage 303 is an operational amplifier stage 303. This operational amplifier stage 303 has an operational amplifier 322. An input of the operational amplifier 322 is connected directly to the input 304 of the first active stage 303, and an output of the operational amplifier 322 is connected directly to the output 305 of the first active stage 303. In parallel between the input 304 of the first active stage 303 and the output 305 of the first active stage 303, that is to say between the input of the operational amplifier 322 and the output of the operational amplifier 322, the first active stage 303 has a feedback loop 323. The feedback loop 323 in conjunction with the operational amplifier 322 acts as a (active) low-pass filter in the first active stage 303. In the specific exemplary embodiment shown in FIG. 3, the feedback loop 323 is in the form of a parallel circuit comprising an operational amplifier feedback resistor 324 and an operational amplifier feedback capacitor 325. However, other variants of an active low-pass filter within the first active stage 303 are also conceivable. The feedback loop 323 of the operational amplifier 322 is configured to provide a low impedance at the input 304 of the first active stage 303. In this case, a component of the received current signal 101 is compensated for by the feedback signal 107 delivered by the second active stage 306, and, apart from a parasitic input current for the operational amplifier 322, only a residual component of the received current signal 101, which residual component is not compensated for by the feedback signal 107 delivered by the second active stage 306, flows through the feedback loop 323 of the operational amplifier 322.

In other words, the operational amplifier 322 forms a first-order low-pass filter with the feedback loop 323. In order to attain a second-order transfer function at the output of the operational amplifier 322 and hence at the output 305 of the first active stage 303, there is the voltage-controlled current source 311 or the amplifier element 311 acting as a voltage-controlled current source. This voltage-controlled current source 311 feeds the signal (the voltage signal 102) back to the input 304 of the operational amplifier 322, that is to say to the input 304 of the first active stage 303, in order to form a second-order filter. When the current-to-voltage converter 300 shown in FIG. 3 is used in a receiver, e.g. for a mobile telephone, a signal current from a mixer, that is to say the current signal 101 at the input of the operational amplifier 322, can be supplied to the node (the input 304 of the first active stage 303). Since the feedback loop of the operational amplifier 322 means that this node is a low impedance point (at which, on account of the typically high gain of the operational amplifier 322 and on account of the feedback, an almost constant potential, in relation to a reference-ground potential GND, is applied), and since the operational amplifier input itself has a high impedance, the signal current can flow only through the operational amplifier feedback resistor 324, the operational amplifier feedback capacitor 325 of the first active stage 303 and the feedback capacitor 321 between the input of the first active stage 303 and the output 314 of the voltage-controlled current source 311. The operational amplifier feedback capacitor 325 injects a current into this node (into the input 304 of the first active stage 303), as a result of which a first-order filter is formed. The second amplifier (the voltage-controlled current source 311 or the amplifier element 311 acting as a voltage-controlled current source) injects a further additional current (the feedback signal 107 or the feedback current signal), which all in all results in the second-order overall filter function of the current-to-voltage converter 300. The output signal, that is to say the voltage signal 102 from the operational amplifier 322, is subjected to high-pass filtering using the coupling capacitor 320 (e.g. in conjunction with an input resistance of the voltage-controlled current source 311 and possibly with an output resistance of the first active stage 303) and is supplied to the voltage-controlled current source 311 or to the amplifier element 311 acting as a voltage-controlled current source.

An input current component of the first active stage 303 that remains after the feedback via the feedback capacitor 321 has been taken into account flows through the parallel circuit comprising the operational amplifier feedback capacitor 325 and the operational amplifier feedback resistor 324, with a voltage that appears at the output 305 of the active stage 303 being determined by the magnitude of the effective input current component and the impedance of the feedback loop 323.

The voltage-controlled current source 311 or the amplifier element 311 acting as a voltage-controlled current source can also be referred to as a transconductance stage or gm stage.

An output signal 326 from the voltage-controlled current source 311 or from the amplifier element 311 acting as a voltage-controlled current source is therefore a high-pass-filtered version of the output voltage, that is to say of the voltage signal 102. The output signal 326 from the voltage-controlled current source 311 or from the amplifier element 311 acting as a voltage-controlled current source is subjected to high-pass filtering again using the feedback capacitor 321 and is injected into the current summation node (the input 304 of the first active stage 303) of the operational amplifier 322, which results in the second-order overall filter function at the output for the operational amplifier 322, and hence at the output 305 of the first active stage 303.

The output 305 of the first active stage 303 may also be coupled to a subsequent filter stage or a downstream analog-to-digital converter so as to act as an external output for the current-to-voltage converter 300.

In order not to overdrive the gm stage or the voltage-controlled current source 311 or the amplifier element 311 acting as a voltage-controlled current source, it is possible for feedback resistors (that are sometimes but not necessarily present) within this gm stage to have a fairly low resistance, that can result in a higher capacitance for the feedback capacitor 321 that injects the current into the current input node (into the input 304 of the first active stage 303) of the operational amplifier 322. By way of example, a capacitance of the feedback capacitor 321 may be higher by a factor of greater than 2, greater than 5 or even greater than or equal to 10 than a capacitance of the coupling capacitor 320. By way of example, a capacitance of the operational amplifier feedback capacitor may be identical to the capacitance of the coupling capacitor.

A further advantage of the current-to-voltage converter 300 shown in FIG. 3 is that noise in the gm stage does not influence the useful signal, since it is injected into the input node (into the input 304 of the first active stage 303) only via the feedback capacitor 321, which (in conjunction with an input impedance of the first active stage 303 and possibly an output impedance of the voltage-controlled current source 311) forms a high-pass filter, as a result of which there is almost no injection of noise in the passband.

According to some exemplary embodiments, the voltage-controlled current source 311 or the amplifier element 311 acting as a voltage-controlled current source may be a transistor. In this case, a control connection of the transistor may be coupled to the output 305 of the first active stage 303 via the first transfer path having the first high-pass filter characteristic, that is to say via the coupling capacitor 320. In addition, this transistor may be coupled to the input 304 of the first active stage 303 (via the second transfer path having the second high-pass filter characteristic, that is to say via the feedback capacitor 321), in order to feed back at least a portion of its load path current (for example a collector-emitter current or a drain-source current) to the input 304 of the first active stage 303. In other words, the load path current of this transistor (or a portion thereof) can be coupled to the input 304 of the first active stage 303 via the second transfer path having a high-pass filter characteristic. The load path current of the transistor may be, by way of example, the output signal 326 shown in FIG. 3 from the voltage-controlled current source or from the amplifier element 311 acting as a voltage-controlled current source. The feedback signal 107 or the feedback current signal may in this case be a high-pass-filtered version (by the feedback capacitor 321) of the load path current 326 of the transistor.

Although all signals in the exemplary embodiment shown in FIG. 3 are what are known as "single ended" signals, that is to say are referenced to ground potential, it is thus possible, according to further exemplary embodiments, for both the current signal 101 and the voltage signal 102 and the feedback signal 107 each to be differential signals.

Figure 4:
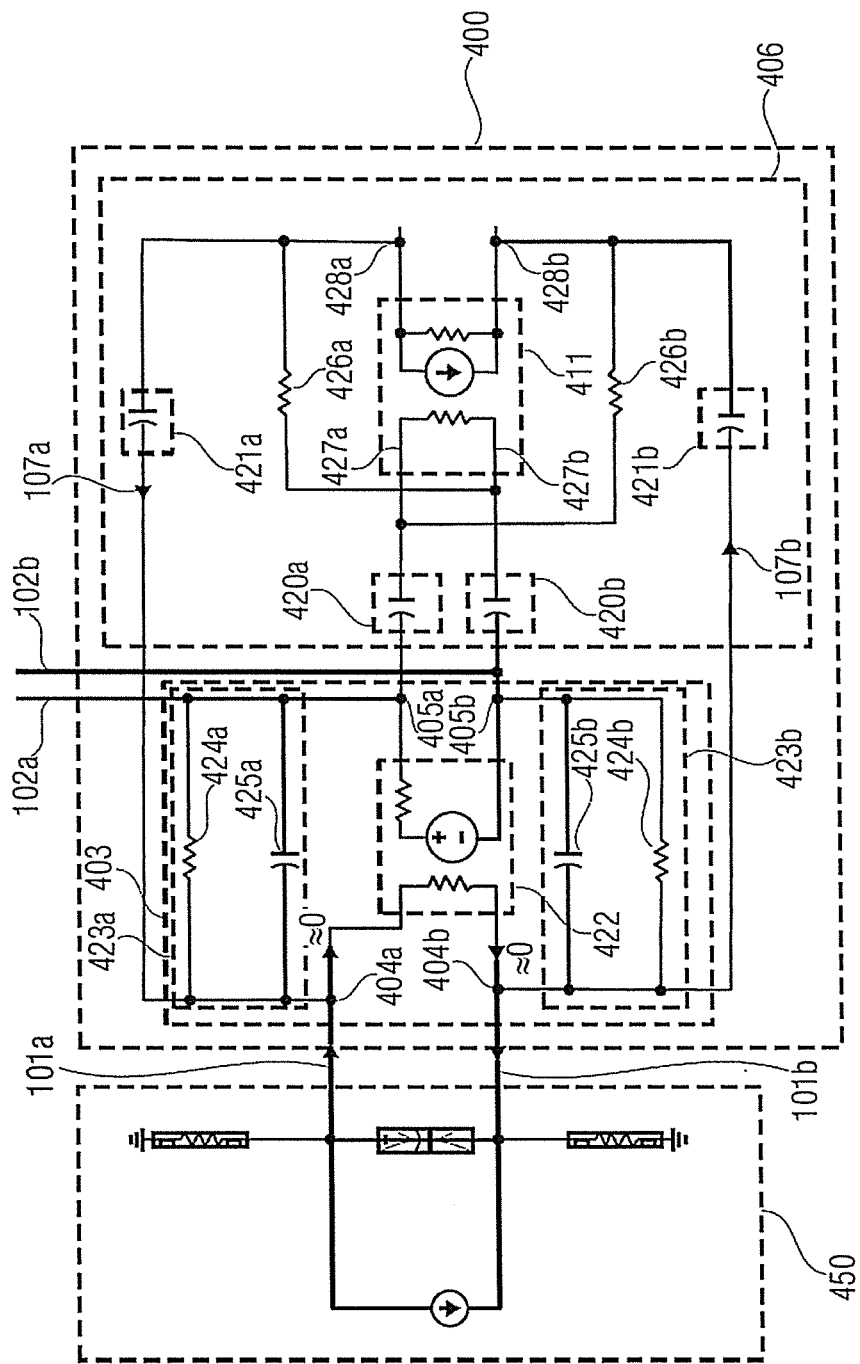
FIG. 4 shows an equivalent circuit diagram of a current-to-voltage converter according to a further exemplary embodiment.

FIG. 4 shows an equivalent circuit diagram of a current-to-voltage converter 400 according to a further exemplary embodiment. The current-to-voltage converter 400 shown in FIG. 4 is designed to process differential signals. According to the equivalent circuit diagram shown in FIG. 4, the current-to-voltage converter 400 has a mixer 450 connected to it which has been modeled by a current source in the equivalent circuit diagram. The mixer 450 is not part of the current-to-voltage converter 400; it is merely intended to be used to clarify how the current-to-voltage converter 400 can be connected to a mixer, for example a mixer in a mobile radio receiver.

According to the equivalent circuit diagram, the current-to-voltage converter 400 can attain the functionality of the current-to-voltage converter 100 shown in FIG. 1, for example. The current-to-voltage converter 400 therefore also has a first active stage 403 and a second active stage 406.

By way of example, the first active stage 103 shown in FIG. 1 may have been implemented by a circuit arrangement that has a functionality according to the equivalent circuit diagram of the first active stage 403. Similarly, the second active stage 106 shown in FIG. 1 may have been implemented by a circuit arrangement that has a functionality according to the equivalent circuit diagram of the second active stage 406, for example. The first active stage 403 is configured to receive at an input a differential current signal, in the form of a first component current signal 101a and a second component current signal 101b.

The first active stage 403 therefore has a first input 404a for receiving the first component current signal 101a and a second input 404b for receiving the second component current signal 101b, which together form a differential input.

The first active stage 403 is also configured to provide a differential voltage signal, in the form of a first component voltage signal 102a and a second component voltage signal 102b, at its output. The first active stage 403 therefore has a first differential output 405a for providing the first component voltage signal 102a and a second differential output 405b for providing the second component voltage signal 102b.

The differential outputs 405a, 405b are simultaneously differential outputs of the current-to-voltage converter 400. Hence, the component voltage signals 102a, 102b are also output signals from the current-to-voltage converter 400. In addition, the differential inputs 404a, 404b of the first active stage 403 are simultaneously differential inputs of the current-to-voltage converter 400, and hence the two component current signals 101a, 101b are also input signals for the current-to-voltage converter 400.

As in the case of the previous exemplary embodiments already, the second active stage 406 of the current-to-voltage converter 400 is coupled between the output of the active stage 403, that is to say between the two differential outputs 405a, 405b of the active stage 403, and the input, that is to say the two differential inputs 404a, 404b of the first active stage 403. In this case, the second active stage 406 is configured to provide a differential feedback signal, as a first component feedback signal 107a and a second component feedback signal 107b, at the input of the first active stage 403. In this case, the differential feedback signal effects frequency-selective counteraction of amplification, by the first active stage 403, of signal components of the current signal 101a, 101b applied to the input of the first active stage 403 which have a frequency outside of a prescribed useful frequency band. More precisely, the first component feedback signal 107a counteracts signal components of the first component current signal 101a that are outside of the prescribed frequency band, and the second component feedback signal 107b counteracts signal components of the second component current signal 101b that are outside of the prescribed useful frequency band.

The design of the two active stages 403 and 406 is similar to the design of the two active stages 303, 306 of the current-to-voltage converter 300 shown in FIG. 3. Thus, in this case too, the first active stage 403 acts as a low-pass filter for the effective component current signals that appear at the differential inputs 404a, 404b, with a first effective component current signal being obtained from the sum of the first received component current signal 101a and the first component feedback signal 107a, and with a second effective component current signal being obtained from the sum of the second received component current signal 101b and the second component feedback signal 107b. The first active stage 403 to this end has an active portion 422, which is in the form of a voltage-controlled voltage source in the equivalent circuit diagram shown in FIG. 4. The voltage-controlled voltage source can be replaced in a genuine implementation, for example by a suitable operational amplifier having a high input impedance (for example in the megaohm range). Between an output of this active portion 422 and an input of the active portion 422, the first active stage 403 has, in a similar manner to the first active stage 303, a first feedback loop 423a having a first operational amplifier feedback resistor 424a and a first operational amplifier feedback capacitor 425a, connected in parallel therewith. The first feedback loop 423a is connected in parallel between the differential input 404a and the differential output 405a of the first active stage 403. In addition, the first active stage 403 has a second feedback loop 423b in parallel between the differential input 404b and the differential output 405b. In a similar manner to the first feedback loop 423a, the second feedback loop 423b has a second operational amplifier feedback resistor 424b in parallel with a second operational amplifier feedback capacitor 425b. The first feedback loop 423a and the second feedback loop 423b therefore form a first-order low-pass filter for the first effective component current signal and the second effective component current signal with the active portion 422 of the first active stage 403.

An active portion of the second active stage 406 is implemented in the equivalent circuit diagram by a voltage-controlled current source 411 in conjunction with a first current source feedback resistor 426a and a second current source feedback resistor 426b. As in the case of the second active stage 306 already, the second active stage 406 also has the input of the active portion 422 of the second active stage 406 coupled to the output of the first active stage 403 via a first transfer path having a first high-pass filter characteristic. To this end, a first connection of a first coupling capacitor 420a of the second active stage 406 is coupled to the differential output 405a of the first active stage 403. In addition, a first connection of a second coupling capacitor 420b of the second active stage 406 is coupled to the second differential output 405b of the first active stage 403. A second connection of the first coupling capacitor 420a is coupled to a first connection of the second current source feedback resistor 426b, and a second connection of the second coupling capacitor 420b is coupled to a first connection of the first current source feedback resistor 426a. The second connection of the first coupling capacitor 420a is furthermore connected to a first control connection 427a of the voltage-controlled current source 411, and the second connection of the second coupling capacitor 420b is furthermore connected to a second control connection 427b of the voltage-controlled current source 411. A second connection of the first current source feedback resistor 426a is connected both to a first output 428a of the voltage-controlled current source 411 and to a first connection of the first feedback capacitor 421a. A second connection of the second current source feedback resistor 426b is connected both to a second output 428b of the voltage-controlled current source 411 and to a first connection of the second feedback capacitor 421b. A second connection of the first feedback capacitor 421a is connected to the first differential input 404a of the first active stage 403. A second connection of the second feedback capacitor 421b is connected to the second differential input 404b of the first active stage 403. The coupling capacitors 420a, 420b form a first high-pass filter for the component voltage signals 102a, 102b in conjunction with the current source feedback resistors 426a, 426b and the voltage-controlled current source 411. The feedback capacitors 421a, 421b form a second high-pass filter with input impedances at the differential inputs 404a, 404b of the first active stage 403 and possibly output impedances of the voltage-controlled current source 411.

The return of the input signal to the differential inputs 404a, 404b using the two component feedback signals 107a, 107b achieves second-order filtering in addition to the first-order filtering within the first active stage 403.

The overall manner of operation of the current-to-voltage converter 400 shown in FIG. 4 will be explained once again in detail below.

It is subsequently assumed that the active portion 422, which has been implemented by a voltage-controlled voltage source in the equivalent circuit diagram shown in FIG. 4, is in the form of an operational amplifier 422. The signal current (in the form of the two component current signals 101a, 101b) from the RX mixer 450 is injected into the circuit using the current source of the mixer 450. In other words, the mixer 450 acts essentially as a current source with reference to the baseband signal and is modeled by a current source in the equivalent circuit diagram in FIG. 4. As already mentioned above, the operational amplifier 422 is in this case modeled as a voltage-controlled voltage source which uses feedback resistors and feedback capacitors (the resistors 424a, 424b and the capacitors 425a, 425b) in order to form a current-to-voltage converter having a first-order low-pass filter. In order to attain a second-order transfer function at the output (at the differential outputs 405a, 405b) of the operational amplifier 422 and hence of the active stage 403, there is the voltage-controlled current source 411 (which can also be referred to as a gm stage) with the two current source feedback resistors 426a, 426b and four capacitors (the coupling capacitors 420a, 420b and the feedback capacitors 421a, 421b), which feeds back the signal to the input of the operational amplifier 422, in order to form the second-order filter.

The underlying functionality involves the signal current being supplied to the node (or to the nodes at the differential inputs 404a, 404b) from the mixer 450 at the input of the operational amplifier 422. Since this node (or the nodes) is a low impedance point on account of the feedback of the operational amplifier 422 (at least inside of the prescribed useful frequency band of the current signal or inside of an operating bandwidth of the active elements), and since the operational amplifier inputs themselves have a high impedance, the signal current can flow only through the operational amplifier feedback resistors 424a, 424b, the operational amplifier feedback capacitors 425a, 425b and the feedback capacitors 421a, 421b. The operational amplifier feedback capacitors 425a, 425b inject current which (e.g. assuming a partial signal amplitude at the outputs 405a, 405b of the operational amplifier 422) increases in the direction of relatively high frequencies into these nodes (into the nodes at the differential inputs 404a, 404b), which forms a first-order filter or as a result of which a first-order filter is obtained. The second amplifier (the second active stage having the voltage-controlled current source 411) overlays this injection by injecting a further additional current (in the form of the two component feedback signals 107a, 107b) which (e.g. assuming a particular signal amplitude at the outputs 405a, 405b of the operational amplifier 422) increases as frequency increases, which overall results in the second-order filtering function. The output signal (in the form of the two component voltage signals 102a, 102b) of the operational amplifier 422 is subjected to high-pass filtering using the coupling capacitors 420a, 420b and is fed into the gm stage (that is to say into the active portion of the second active stage 406). Therefore, the output signal from the gm stage is a high-pass-filtered division of the output voltage from the operational amplifier 422. The voltage is again subjected to high-pass filtering using the feedback capacitors 421a, 421b (or is used to excite a flow of current in a manner such that, for a prescribed voltage amplitude, the current increases as frequency rises) and is injected into the current summation node at the input of the operational amplifier 422 (that is to say at the differential inputs 404a, 404b of the first active stage 403), which results in the second-order overall filtering at the output (at the differential outputs 405a, 405b) of the operational amplifier 422 and hence of the active stage 403.

As already mentioned, the output of the active stage 403 is the output which can lead to a subsequent filtering stage or to a downstream analog-to-digital converter (or may be coupled to the latter). The two differential outputs 405a, 405b therefore form an output of the current-to-voltage converter 400. So as not to overdrive the gm stage (more precisely the active portion of the second active stage 406), the feedback resistors of the gm stage (the current source feedback resistors 426a, 426b) may have a fairly low impedance, which results in a relatively high capacitance for the feedback capacitors 421a, 421b which inject the current into the current input node of the operational amplifier 422.

As already mentioned, a capacitance of the two feedback capacitors 421a, 421b may be higher by a factor of greater than 2, greater than 5 or even greater than or equal to 10 than a capacitance of the two coupling capacitors 420a, 420b.

In a similar manner to the current-to-voltage converter 300, a further advantage in this case too is that the noise in the gm stage does not influence the useful signal, since the signal is injected into the input node only via capacitors (via the feedback capacitors 421a, 421b) which form a high-pass filter (or a voltage-to-current converter having a high-pass characteristic), as a result of which there is almost no noise injection in the passband.

The text below describes a few dimensioning rules that can be considered in some exemplary embodiments, but from which it is also possible to depart.

According to some exemplary embodiments of the present invention, resistance values of the first operational amplifier feedback resistor 424a and the second operational amplifier feedback resistor 424b may be identical. In addition, capacitances of the two operational amplifier feedback capacitors 425a, 425b may be identical. In addition, capacitances of the two coupling capacitors 420a, 420b may be identical. In addition, resistances of the two current source feedback resistors 426a, 426b may be identical. In addition, capacitances of the two feedback capacitors 421a, 421b may be identical.

According to further exemplary embodiments of the present invention, the capacitances of the two coupling capacitors 420a, 420b may be identical to the capacitances of the two operational amplifier feedback capacitors 425a, 425b. As already mentioned, the capacitances of the two feedback resistors 421a, 421b may be greater by a factor of greater than 2, greater than 5 or even greater than or equal to 10 than the capacitances of the two coupling capacitors 420a, 420b and/or than the capacitances of the two operational amplifier feedback capacitors 425a, 425b. The resistance values of the two current source capacitors 426a, 426b may, by contrast, be smaller by a factor of greater than 5, greater than 10 or even greater than or equal to 20 than the resistance values of the two operational amplifier feedback resistors 424a, 424b.

According to one specific exemplary embodiment of the present invention, a capacitance of the operational amplifier feedback capacitors 425a, 425b and of the coupling capacitors 420a, 420b may be a value of 4.0 pF (±20%). In addition, a capacitance of the two feedback capacitors 421a, 421b may be a value of 50.0 pF (±20%). A resistance value of the two operational amplifier feedback resistors 424a, 424b may be 5000 (±10%) ohms. A resistance value of the two current source feedback resistors 426a, 426b may be 250 (±10%) ohms.

In order to ensure a stability for the circuit and in particular for the first active stage 403, a gain in the voltage-controlled voltage source or in the operational amplifier may be negative, for example the gain may have a value of −1,000,000. In other words, negative feedback is effected in the active stage 403 by means of the operational amplifier feedback capacitors 425a, 425b and the operational amplifier feedback resistors 424a, 424b.

Figure 5:
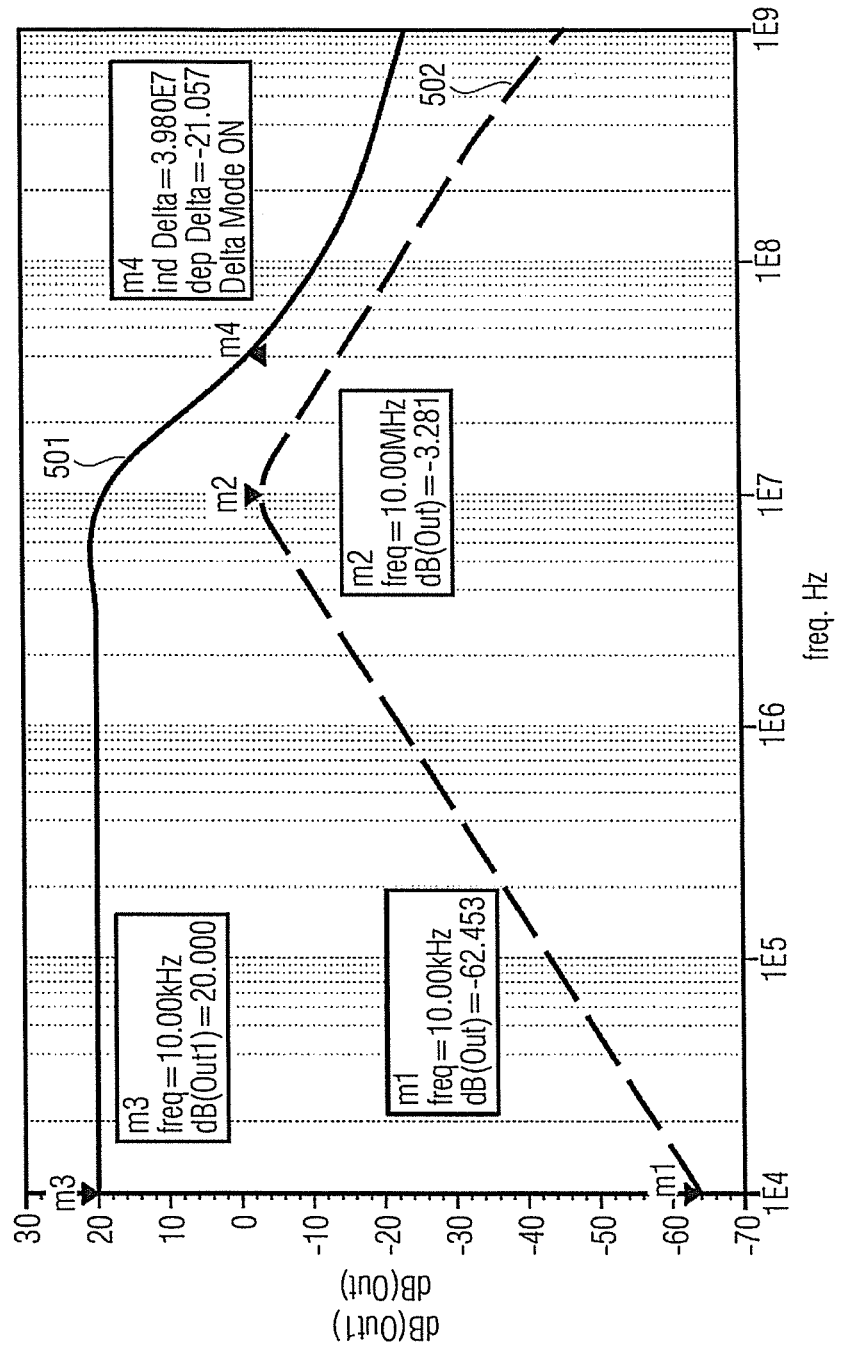
FIG. 5 shows a graph with characteristic curves to represent the transfer function of the current-to-voltage converter shown in FIG. 4.

FIG. 5 uses a graph to show transfer functions, as can be derived from the equivalent circuit diagram shown in FIG. 4 for the current-to-voltage converter 400. In the graph, FIG. 5 uses a solid curve 501 to show the transfer function from the input current (that is to say from the current signal 101a, 101b received at the differential inputs 404a, 404b) to the output signal from the operational amplifier 422, that is to say the difference voltage between the component voltage signals 102a, 102b at the two differential outputs 405a, 405b of the first active stage 403.

In addition, the graph in FIG. 5 uses a dashed curve 502 to show the transfer function from the input current at the two differential inputs 404a, 404b of the first active stage 403 to the output signal from the gm stage (that is to say to the output signals from the active portion 411 or from the voltage-controlled current source 411 of the second active stage 406).

The graph plots the frequency on the abscissa logarithmically over a range from 10 000 kHz to 1 GHz and plots an attenuation or gain on the ordinate in a range from −70 dB to +30 dB.

The solid curve 501, which represents the overall transfer function of the current-to-voltage converter 400, clearly reveals the second-order low-pass filtering of the operational amplifier output signal. The input signal for the current-to-voltage converter 400, that is to say the current signal received at the differential inputs 404a, 404b, is therefore attenuated to a (much) greater degree in the range outside of the prescribed useful frequency band than is the case with a first-order filter. In addition, it is evident from the dashed curve 502 in conjunction with the solid curve 501 that the voltage swing at the output of the gm stage, that is to say at the output of the active portion 411 of the second active stage 403, is substantially smaller than the voltage swing on the operational amplifier 422, and this therefore cannot be a restricting factor. The dashed curve 502 reveals the first-order high-pass filtering in a first frequency range, which may be a useful frequency band of the current-to-voltage converter 400, for example, and extends from 0 Hz to 10 MHz, for example. The first-order high-pass filtering is formed by the two coupling capacitors 420a, 420b in conjunction with the current source feedback resistors 426a, 426b and the active portion 411. In addition, the dashed curve 502 reveals a first-order low-pass filtering in a second frequency range, which may be outside of or above the useful frequency band of the current-to-voltage converter 400, for example, and contains frequencies above 10 MHz, for example, said first-order low-pass filtering being formed from a superimposition comprising the overall transfer characteristic (the second-order low-pass filter characteristic) of the second-order current-to-voltage converter and the first-order high-pass filter characteristic of the second active stage.

Figure 6:
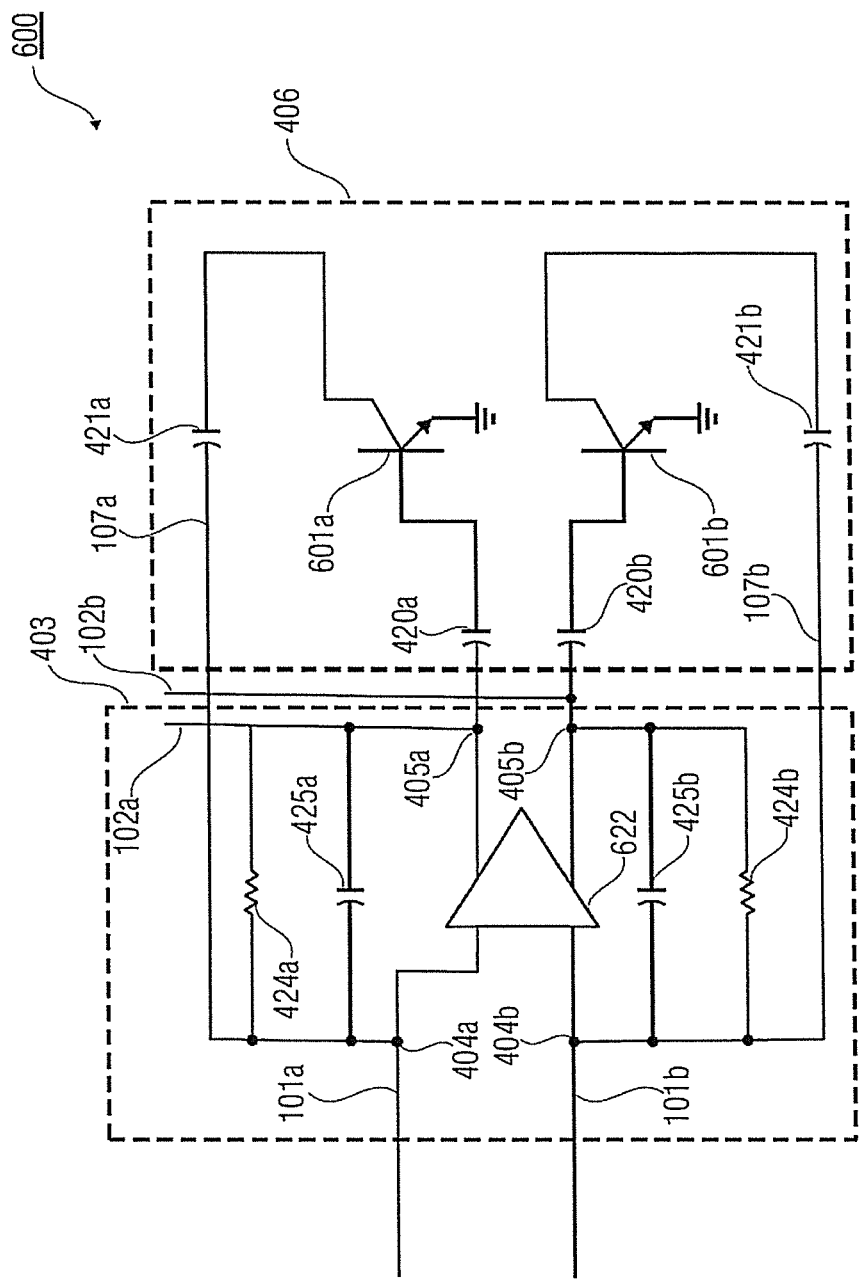
FIG. 6 shows a circuit diagram of a current-to-voltage converter according to a further exemplary embodiment.

FIG. 6 shows a circuit diagram of a current-to-voltage converter 600 according to a further exemplary embodiment. The current-to-voltage converter 600 shown in FIG. 6 is a possible specific implementation (for the sake of clarity, additional elements, which are used for setting the DC voltage operating points, for example, are not shown) of the current-to-voltage converter 400 shown in FIG. 4 as an equivalent circuit diagram. In the specific implementation shown in FIG. 6, the first active stage 403 has an operational amplifier 622 instead of the voltage-controlled voltage source 422. The first active stage 403 therefore forms an operational amplifier stage 403. The operational amplifier 622 has a high input impedance and a comparatively low output impedance. In addition, the specific implementation shown in FIG. 6 has a first current source transistor 601 and a second current source transistor 601b instead of the active stage 411 having the two current source feedback resistors 426a, 426b (elements for setting operating point and an additional load impedance which may be present not being shown in FIG. 6 for the sake of simplification). A control connection of the first current source transistor 601a is coupled to the second connection of the first coupling capacitor 420a. A control connection of the second current source transistor 601b is coupled to the second connection of the second coupling capacitor 420b. In other words, the control connections of the two current source transistors 601a, 601b are coupled to the outputs of the first active stage 403 via signal paths having a high-pass filter characteristic. A first load path connection (for example a collector connection or a drain connection or an output connection) of the first current source transistor 601a is coupled to the second connection of the first feedback capacitor 421a, and a first load path connection of the second current source transistor 601b is coupled to the second connection of the second feedback capacitor 421b. In other words, load paths (for example between collector connections and emitter connections or between drain connections and source connections) of the two current source transistors 601a, 601b are coupled to the inputs of the first active stage 403 via signal paths having a high-pass filter characteristic. Hence, at least a portion of the load path currents (for example collector-emitter currents or drain-source currents or output currents) of the two current source transistors 601a, 601b is returned to the inputs of the first active stage 403. In other words, the first component feedback signal 107a is based on a load path current of the first current source transistor 601a, and the second component feedback signal 107b is based on a load path current of the second current source transistor 601b.

The two current source transistors 601a, 601b may be transistors using any transistor technique, such as bipolar or MOSFET technology. In addition, other amplifier elements acting as voltage-controlled voltage sources can also be used, including different interconnection for the two current source transistors 601a, 601b.

Instead of using a transistor in the second active stage 403, it is naturally also possible to use a further operational amplifier, for example having a current output and a high output impedance connected thereto, as is the case in a transconductance amplifier (OTA), for example.

According to some exemplary embodiments, the prescribed useful frequency band mentioned above may have an upper cutoff frequency (for example an upper 3 dB cutoff frequency) in a range from 10 kHz to 50 MHz.

Figure 7:
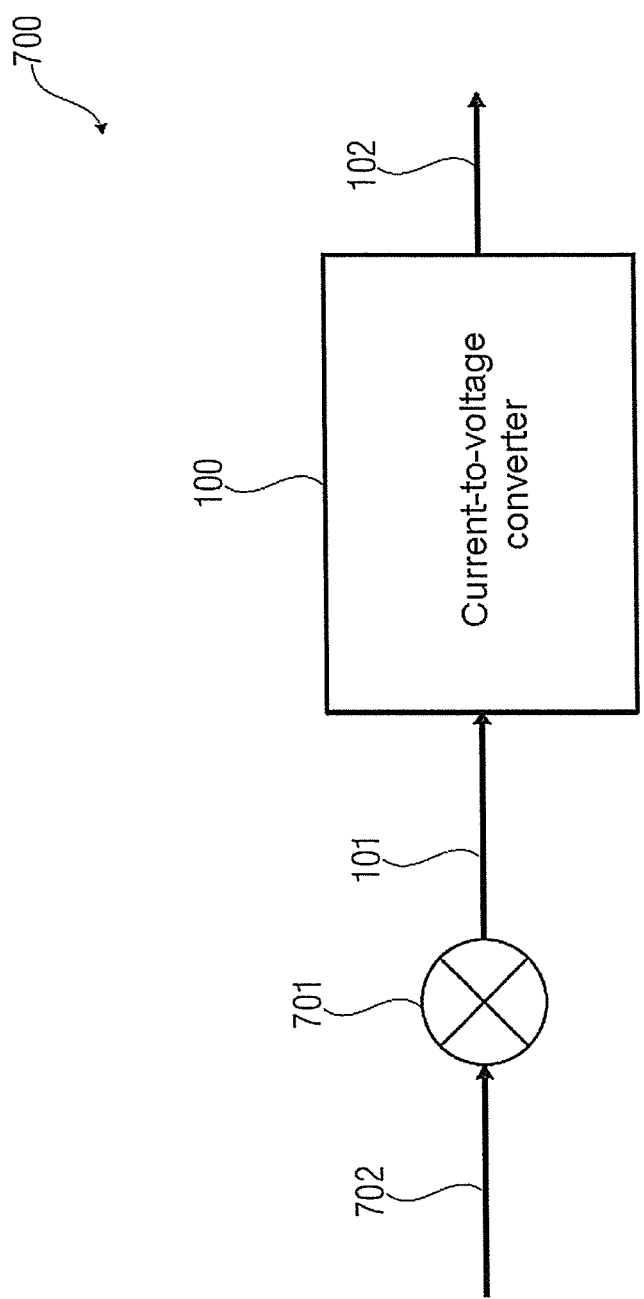
FIG. 7 shows a block diagram of a receiver according to a further exemplary embodiment.

FIG. 7 shows a block diagram of a receiver 700 according to a further exemplary embodiment. The receiver 700 has a mixer 701 and a current-to-voltage converter 100. Instead of the current-to-voltage converter 100, it is also possible to use a different current-to-voltage converter according to an exemplary embodiment (for example one of the current-to-voltage converters 200, 300, 400 and 600). The mixer 701 is designed to down convert a received signal 702 to a baseband in order to obtain a baseband signal, and in order to provide the baseband signal for the current-to-voltage converter 100 as the current signal 101. As already mentioned, the use of a current-to-voltage converter according to an exemplary embodiment of the present invention in the receiver 700 allows the receiver 700 to be implemented without an intermediate stage filter and with a low supply voltage. Through the use of the current-to-voltage converter 100 or of a different current-to-voltage converter according to an exemplary embodiment, the receiver 700 therefore has the advantage over conventional receivers that it makes do with lower circuit complexity and hence lower material costs and can operate at a lower supply voltage and hence a lower power draw.

As already explained above, the current-to-voltage converter 100 can act as a second-order filter. According to one exemplary embodiment, the receiver 700 can therefore use a second-order filter in the current-to-voltage converter 100 downstream of the mixer 701 in order to allow a filter-free low voltage design.

According to some exemplary embodiments, an output of the mixer 701 at which the current signal 101 is provided may be connected directly to the input of the first active stage of the current-to-voltage converter 100.

Figure 8:
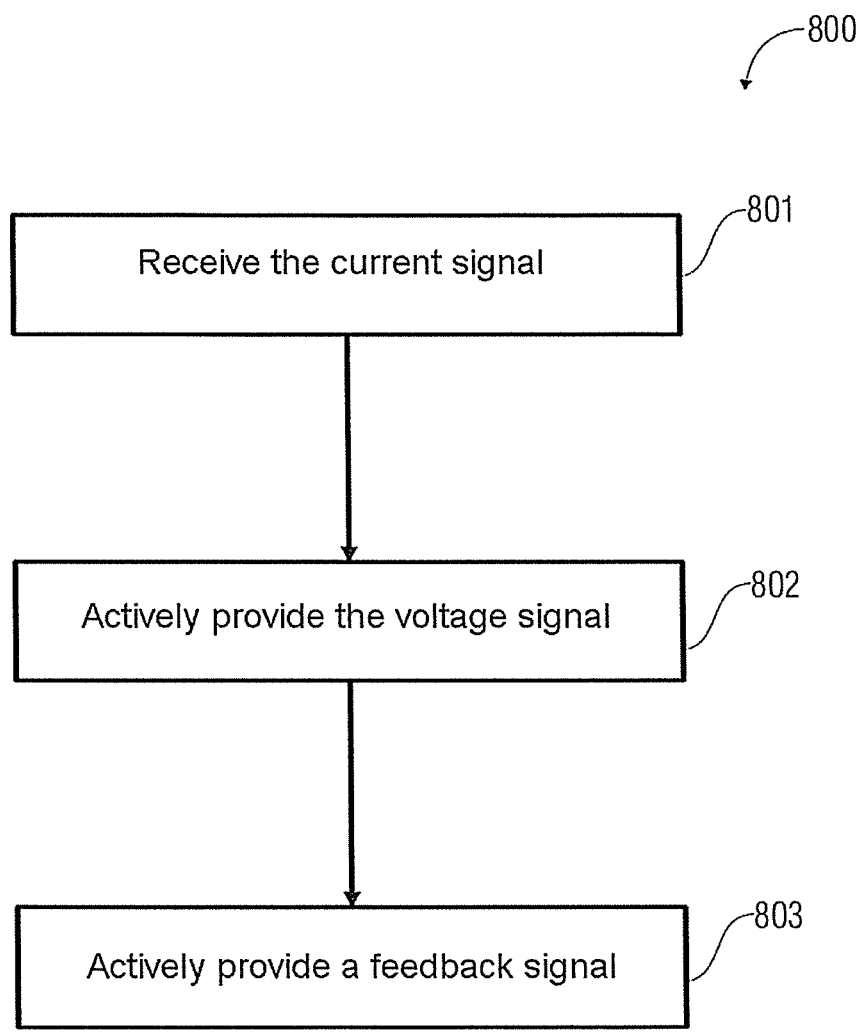
FIG. 8 shows a flowchart of a method according to a further exemplary embodiment.

FIG. 8 shows a flowchart of a method 800 according to a further exemplary embodiment. The method 800 for providing a voltage signal has a step 801 of receiving a current signal at an input.

In addition, the method 800 has a step 802 of actively providing the voltage signal based on the current signal. The active provision 802 of the voltage signal can involve first-order low-pass filtering, as a result of which the voltage signal is at least partially based on a low-pass-filtered version of the current signal. Both the reception 801 of the current signal and the active provision 802 of the voltage signal can be performed in one of the first active stages—mentioned above—of one of the current-to-voltage converters, for example.

In addition, the method 800 has a step 803 of actively providing a feedback signal at the input. The feedback signal effects frequency-selective counteraction of amplification of signal components of the current signal which have a frequency outside of a prescribed useful frequency band. The feedback signal can be formed based on the voltage signal, for example. The active provision 803 of the feedback signal can be performed in one of the second active stages—mentioned above—of the current-to-voltage converters, for example.

The method 800 can be complemented by all the features and functionalities which have been described herein in relation to the apparatuses.

Figure 9:
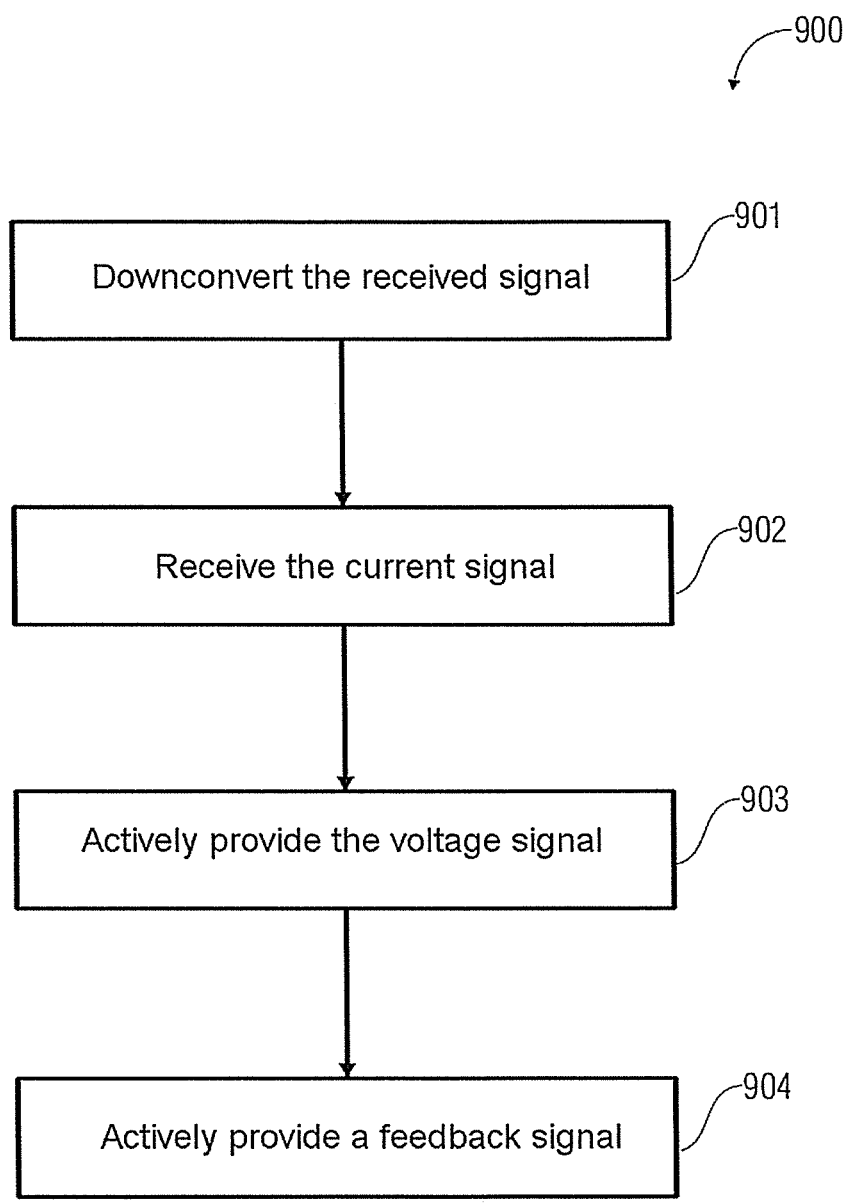
FIG. 9 shows a flowchart of a method according to a further exemplary embodiment.

FIG. 9 shows a flowchart of a method 900 according to a further exemplary embodiment.

The method 900 for receiving a received signal has a step 901 of down converting the received signal to a baseband in order to obtain a baseband signal and in order to provide the baseband signal as a current signal.

In addition, the method 900 has a step 902 of receiving the current signal at an input.

In addition, the method 903 has a step of actively providing a voltage signal on the basis of the current signal.

In addition, the method 900 has a step 904 of actively providing a feedback signal that affects frequency-selective counteraction of amplification of signal components of the current signal which have a frequency outside of a prescribed useful frequency band at the input.

The text below will now explain a few aspects of exemplary embodiments once again.

Some exemplary embodiments provide a receiver in which a circuit is added to the first pole downstream of the current output of the mixer in order to attain second-order filtering before the voltage range is entered, in order to allow a receiver without an intermediate stage filter with a low supply voltage.

Some exemplary embodiments use a second-order filter in the current-to-voltage converter downstream of the mixer in order to allow a filter-free low voltage design.

Some exemplary embodiments provide a current-to-voltage converter having second-order filtering.

Some further exemplary embodiments provide an implementation of a current-to-voltage converter having second-order filtering.

Some further exemplary embodiments provide a receiver having a low RX supply voltage together with an RX design which is free of an intermediate stage filter.

Although some aspects have been described in connection with an apparatus, it goes without saying that these aspects are also a description of the corresponding method, and as a result of which a block or a component of an apparatus can also be understood to mean a corresponding method step or a feature of a method step. Similarly, aspects which have been described in connection with a method step or as a method step are also a description of a corresponding block or detail or feature of a corresponding apparatus.

The invention claimed is:

1. A current-to-voltage converter configured to provide a voltage signal based on a current signal, comprising:
a first active stage having an input and an output, wherein the first active stage is configured to receive the current signal at its input and provide the voltage signal at its output; and
a second active stage coupled between the output of the first active stage and the input of the first active stage, wherein the second active stage is configured to provide the input of the first active stage with a feedback signal that frequency-selectively counteracts an amplification, by the first active stage, of signal components of the current signal applied to the input of the first active stage that have a frequency outside of a prescribed useful frequency band,
wherein the first active stage is configured to act as a low-pass filter, and
wherein a first transfer path from the output of the first active stage to an input of an active portion of the second active stage has a first high-pass filter characteristic, and a second transfer path from an output of the active portion of the second active stage to the input of the first active stage has a second high-pass filter characteristic.

2. A current-to-voltage converter configured to provide a voltage signal based on a current signal, comprising:
a first active stage having an input and an output, wherein the first active stage is configured to receive the current signal at its input and provide the voltage signal at its output; and
a second active stage coupled between the output of the first active stage and the input of the first active stage, wherein the second active stage is configured to provide the input of the first active stage with a feedback signal that frequency-selectively counteracts an amplification, by the first active stage, of signal components of the current signal applied to the input of the first active stage that have a frequency outside of a prescribed useful frequency band,
wherein the first active stage and the second active stage are configured such that an overall transfer function from the input of the first active stage to the output of the first active stage corresponds to a low-pass filter transfer function with an order greater than 1.

3. The current-to-voltage converter as claimed in claim 1, wherein the second active stage is configured to provide the feedback signal as a feedback current signal that is directed against the received current signal and that is based on the voltage signal at the output of the first active stage.

4. The current-to-voltage converter as claimed in claim 3, wherein the first active stage is configured to impress a compensating current as feedback into its input in order to form a first-order low-pass filter;
wherein the second active stage is configured to provide the feedback current signal such that the feedback current signal is superimposed on the compensating current at least outside of the useful frequency band at the input of the first active stage, as a result of which an overall transfer function from the input of the first active stage to the output of the first active stage has a characteristic of a low-pass filter of an order greater than 1.

5. The current-to-voltage converter as claimed in claim 1, wherein the second active stage is configured such that a gain in the voltage signal applied to the output of the first active stage increases as the frequency of the voltage signal applied to the output of the first active stage increases.

6. The current-to-voltage converter as claimed in claim 1, wherein an input resistance at the input of the first active stage is in a range below 100 ohms for the prescribed useful frequency band.

7. The current-to-voltage converter as claimed in claim 1, wherein the first active stage is an operational amplifier stage that has at least one operational amplifier connected between the input of the operational amplifier stage and the output of the operational amplifier stage;
wherein a feedback loop for the operational amplifier is configured to provide the input of the operational amplifier stage with a low impedance; and
wherein the feedback loop of the operational amplifier is also configured such that a component of the received current signal is compensated for by the feedback signal delivered by the second active stage, and that, apart from a parasitic input current for the operational amplifier, only a residual component of the received current signal, which residual component is not compensated for by the feedback signal delivered by the second active stage, flows through the feedback loop of the operational amplifier in the first active stage.

8. The current-to-voltage converter as claimed in claim 1, wherein the second active stage has an amplifier element that operates as a voltage-controlled current source and that is configured to provide the feedback signal as a feedback current signal based on a high-pass-filtered version of the voltage signal.

9. A current-to-voltage converter configured to provide a voltage signal based on a current signal, comprising:
a first active stage having an input and an output, wherein the first active stage is configured to receive the current signal at its input and provide the voltage signal at its output; and
a second active stage coupled between the output of the first active stage and the input of the first active stage, wherein the second active stage is configured to provide the input of the first active stage with a feedback signal that frequency-selectively counteracts an amplification, by the first active stage, of signal components of the current signal applied to the input of the first active stage that have a frequency outside of a prescribed useful frequency band,
wherein the second active stage has an amplifier element that operates as a voltage-controlled current source and that is configured to provide the feedback signal as a feedback current signal based on a high-pass-filtered version of the voltage signal,
wherein the amplifier element acting as a voltage-controlled current source comprises a transistor, wherein a control connection of the transistor is coupled to the output of the first active stage via a first transfer path having a high-pass filter characteristic; and
wherein also an output connection of the transistor is coupled to the input of the first active stage in order to return at least one portion of its output current to the input of the first active stage.

10. The current-to-voltage converter as claimed in claim 9, wherein the output connection of the transistor is coupled to the input of the first active stage via a second transfer path having a high-pass filter characteristic.

11. The current-to-voltage converter as claimed in claim 8, wherein which the output of the first active stage is coupled to an input of the amplifier element acting as a voltage-controlled current source via at least one coupling capacitor;
wherein an output of the amplifier element acting as a voltage-controlled current source is coupled to the input of the first active stage via at least one feedback capacitor; and
wherein a capacitance of the at least one coupling capacitor is smaller by at least a factor of 2 than a capacitance of the at least one feedback capacitor.

12. A current-to-voltage converter configured to provide a voltage signal based on a current signal, comprising:
a first active stage having an input and an output, wherein the first active stage is configured to receive the current signal at its input and provide the voltage signal at its output; and
a second active stage coupled between the output of the first active stage and the input of the first active stage, wherein the second active stage is configured to provide the input of the first active stage with a feedback signal that frequency-selectively counteracts an amplification, by the first active stage, of signal components of the current signal applied to the input of the first active stage that have a frequency outside of a prescribed useful frequency band,
wherein the current signal is a differential signal that has a first component current signal and a second component current signal;
wherein the first active stage is configured to provide the voltage signal at its output as a differential voltage signal having a first component voltage signal and a second component voltage signal; and
wherein the second active stage is configured to provide the feedback signal at the input of the first active stage as a differential feedback signal having a first component feedback signal and a second component feedback signal.

13. The current-to-voltage converter as claimed in claim 1, wherein the prescribed useful frequency band has an upper cutoff frequency in a range from 10 kHz to 50 MHz.

14. A receiver, comprising:
a mixer configured to generate a current signal; and
a current-to-voltage converter configured to provide a voltage signal based on the current signal from the mixer, the current-to-voltage converter comprising:
a first active stage having an input and an output, wherein the first active stage is configured to receive the current signal at its input and provide the voltage signal at its output; and
a second active stage coupled between the output of the first active stage and the input of the first active stage, wherein the second active stage is configured to provide the input of the first active stage with a feedback signal that frequency-selectively counteracts an amplification, by the first active stage, of signal components of the current signal applied to the input of the first active stage that have a frequency outside of a prescribed useful frequency band,
wherein the first active stage is configured to act as a low-pass filter, and
wherein a first transfer path from the output of the first active stage to an input of an active portion of the second active stage has a first high-pass filter characteristic, and a second transfer path from an output of the active portion of the second active stage to the input of the first active stage has a second high-pass filter characteristic, and
wherein the mixer is configured to down convert a received signal to a baseband in order to obtain a baseband signal and provide the baseband signal to the current-to-voltage converter as the current signal.

15. The receiver as claimed in claim 14, wherein an output of the mixer, at which the current signal is provided, is connected directly to the input of the first active stage of the current-to-voltage converter.

16. A current-to-voltage converter configured to provide a voltage signal based on a current signal, comprising:
a first active stage having an input and an output; and
a second active stage coupled between the output of the first active stage and the input of the first active stage;
wherein the first active stage is configured to receive the current signal at its input and provide the voltage signal at its output;
wherein the second active stage is configured to provide the input of the first active stage with a feedback signal that frequency-selectively counteracts amplification, by the first active stage, of signal components of the current signal applied to the input of the first active stage that have a frequency outside of a prescribed useful frequency band;
wherein the first active stage is an operational amplifier stage that has at least one operational amplifier connected to the input of the operational amplifier stage and the output of the operational amplifier stage;

wherein a feedback loop for the operational amplifier is configured to provide the input of the operational amplifier stage with a low impedance;

wherein the feedback loop of the operational amplifier is also configured such that a component of the received current signal is compensated for by the feedback signal delivered by the second active stage, and that, apart from a parasitic input current for the operational amplifier, only a residual component of the received current signal, which residual component is not compensated for by the feedback signal delivered by the second active stage, flows through the feedback loop of the operational amplifier;

wherein the second active stage has an amplifier element that acts as a voltage-controlled current source and that is configured to provide the feedback signal as a feedback current signal based on a high-pass-filtered version of the voltage signal;

wherein an output impedance of the amplifier element acting as a voltage-controlled current source is greater by at least a factor of 100 than an input impedance at the input of the operational amplifier stage;

wherein the output of the operational amplifier stage is coupled to an input of the amplifier element acting as a voltage-controlled current source via at least one coupling capacitor;

wherein an output of the amplifier element acting as a voltage-controlled current source is coupled to the input of the operational amplifier stage via at least one feedback capacitor;

wherein the operational amplifier stage is configured to impress a compensating current as feedback into its input in order to form a first-order low-pass filter; and wherein the second active stage is configured to provide the feedback current signal such that the feedback current signal is superimposed on the compensating current at least outside of the useful frequency band at the input of the operational amplifier stage, as a result of which an overall transfer function from the input of the operational amplifier stage to the output of the operational amplifier stage has a characteristic of a low-pass filter of an order greater than 1.

* * * * *